United States Patent
Lin

(10) Patent No.: US 8,607,849 B2
(45) Date of Patent: Dec. 17, 2013

(54) HEAT RADIATING FIN

(75) Inventor: Kuo-Sheng Lin, Sinjhuang (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 13/364,591

(22) Filed: Feb. 2, 2012

(65) Prior Publication Data
US 2012/0125591 A1 May 24, 2012

Related U.S. Application Data

(62) Division of application No. 12/082,704, filed on Apr. 11, 2008, now abandoned.

(30) Foreign Application Priority Data

Dec. 4, 2007 (TW) .............................. 96220556 U

(51) Int. Cl.
*F28F 7/00* (2006.01)
(52) U.S. Cl.
USPC ....................................................... 165/80.3
(58) Field of Classification Search
USPC ....................................................... 165/80.3
See application file for complete search history.

(56) References Cited

U.S. PATENT DOCUMENTS

| | | |
|---|---|---|
| 2,602,650 A | 7/1952 | Marcotte |
| 3,780,797 A | 12/1973 | Gebelius |
| 5,567,986 A | 10/1996 | Ishida |
| 5,654,587 A | 8/1997 | Schneider et al. |
| 5,794,684 A | 8/1998 | Jacoby |
| 6,741,468 B2 | 5/2004 | Jing et al. |
| 6,765,799 B1 | 7/2004 | Huang |
| 7,190,588 B2 | 3/2007 | Lee et al. |
| 7,426,956 B2 | 9/2008 | Lin et al. |
| 2004/0026073 A1* | 2/2004 | Alex et al. ..................... 165/182 |
| 2006/0260792 A1 | 11/2006 | Wang et al. |
| 2006/0266500 A1 | 11/2006 | Lin et al. |
| 2007/0039726 A1 | 2/2007 | Lee |
| 2008/0017350 A1* | 1/2008 | Hwang et al. ................ 165/80.3 |

* cited by examiner

*Primary Examiner* — Brandon M Rosati

(57) ABSTRACT

A heat radiating fin includes a flat body having a front side and a rear side, a plurality of protruded portions formed on the front side of the flat body, and a plurality of recessed portions correspondingly formed on the rear side of the flat body behind the protruded portions. The protruded portions on the flat body of a first heat radiating fin are partially extendable into corresponding recessed portions on the flat body of a second heat radiating fin located before the first one, allowing the first and the second heat radiating fins to be easily and stably stacked.

1 Claim, 13 Drawing Sheets

HEAT RADIATING FIN

CROSS-REFERENCE TO RELATED APPLICATIONS

The present application is a division of U.S. patent application Ser. No. 12/082,704, filed on Apr. 11, 2008, titled Heat Radiating Fin, listing Kuo-Sheng Lin as inventor.

FIELD OF THE INVENTION

The present invention relates to a heat radiating fin, and more particularly to heat radiating fins that can be easily manufactured to have enhanced structural strength and be stably stacked to form a heat sink.

BACKGROUND OF THE INVENTION

With the constantly developed technologies, many electronic elements in electronic apparatus and devices operate at an increasingly high speed and produce more heat than before. As a result, there is an urgent demand for an improved heat sink. A conventional heat sink usually includes a large number of stacked heat radiating fins to achieve an enhanced heat radiating and dissipating effect. Therefore, it has become an important task for the electronic industrial field to research and develop newer, more efficient, and cost-effective heat radiating fins.

FIG. 1 shows a conventional heat radiating fin 1 and FIG. 2 shows the assembling of a plurality of the heat radiating fins 1 into a heat sink. As shown, the heat radiating fin 1 is formed at two lateral sides with two corresponding bent edges 11, on each of which a receiving slot 111 and a retaining catch 112 are formed. The conventional heat radiating fin 1 is also formed on a flat body 12 thereof with at least one through hole 10, via which a heat pipe 2 may be extended to thereby associate with the heat radiating fin 1. When two or more heat radiating fins 1 are stacked to form a heat sink, the retaining catches 112 on the bent edges 11 of a first heat radiating fin 1 are engaged with the receiving slots 111 on the bent edges 11 of a second heat radiating fin 1 located before the first heat radiating fin 1, so that the stacked heat radiating fins 1 are connected to one another.

To fabricate the conventional heat radiating fin 1, first bend two lateral sides thereof to form the two bent edges 11, and then form the receiving slots 111 and retaining catches 112 on the bent edges 11 by stamping or other suitable ways. Therefore, the forming of the conventional heat radiating fin 1 involves in many complicated machining procedures, and the forming of the heat sink by assembling the heat radiating fins 1 takes a lot of time and labor. Moreover, the forming of the receiving slots 111 and the retaining catches 112 by stamping produces a large quantity of scraps and is subject to high bad yield to further increase the overall cost of the heat radiating fin 1.

When the conventional heat radiating fin 1 is dismounted from the assembled heat sink, the receiving slots 111 and the retaining catches 112 on the bent edges 11 will more or less become deformed due to the external pressure applied to the heat radiating fin 1 for dismounting it from the assembled heat sink. Therefore, when the heat radiating fin 1 dismounted from the assembled heat sink is remounted to the heat sink, it would usually fail to fitly and tightly engage with other heat radiating fins 1 as before, and tends to separate therefrom.

In brief, the conventional heat radiating fin 1 has the following disadvantages: (1) it requires extra time and labor to fabricate; (2) many complicated fabricating procedures are involved to increase the manufacturing cost; (3) a large quantity of scraps is produced; and (4) the receiving slots and the retaining catches are easily deformed under external force, preventing the dismounted heat radiating fin from being fitly and tightly remounted to the heat sink. It is therefore tried by the inventor to develop an improved heat radiating fin to overcome the drawbacks in the conventional heat radiating fin.

SUMMARY OF THE INVENTION

A primary object of the present invention is to provide a heat radiating fin that enables easy assembling of it to other ones to form a heat sink and may be dismounted from and remounted to the heat sink without deformation.

Another object of the present invention is to provide a heat radiating fin that can be fabricated with largely reduced material without producing a large quantity of scraps.

A further object of the present invention is to provide a heat radiating fin that can be quickly fabricated at decreased labor and time to lower the overall cost thereof.

To achieve the above and other objects, the heat radiating fin according to the present invention includes a flat body having a front side and a rear side, a plurality of protruded portions formed on the front side of the flat body by way of stretching or drawing to have a predetermined height, and a plurality of recessed portions correspondingly formed on the rear side of the flat body behind the protruded portions. The protruded portions on the flat body of a first heat radiating fin are partially extendable into corresponding recessed portions on the flat body of a second heat radiating fin located before the first one, allowing the first and the second heat radiating fin to be easily and stably stacked.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
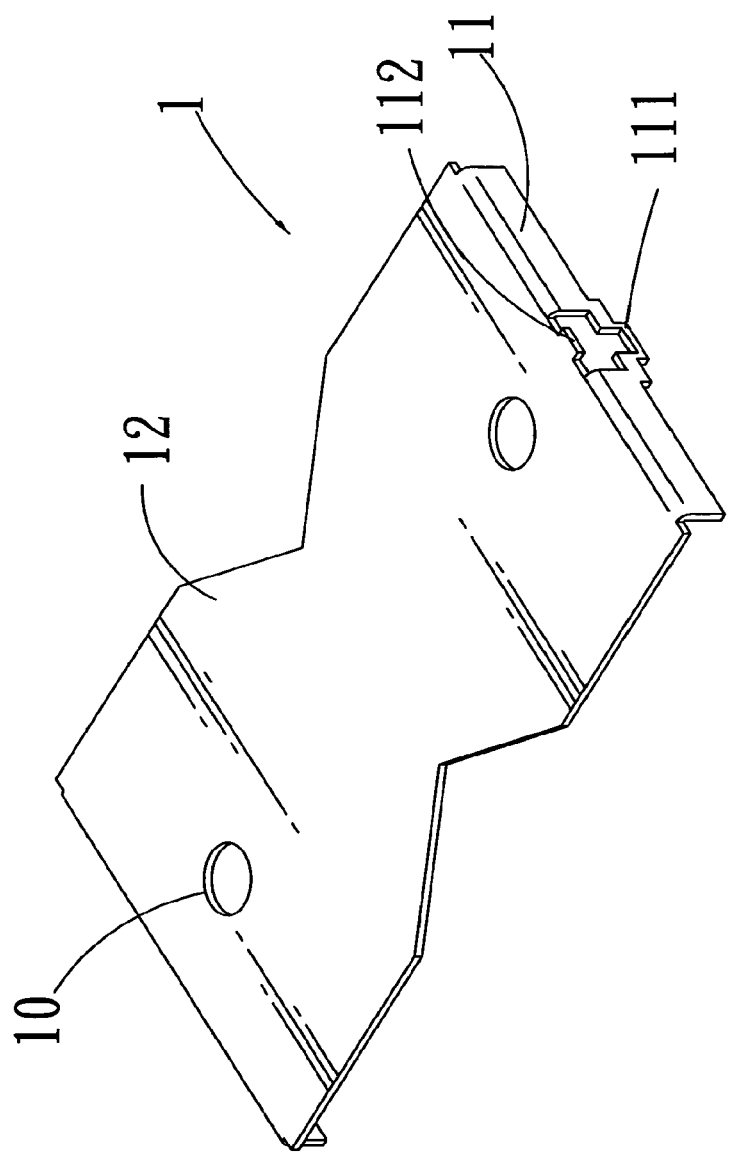
FIG. 1 is a perspective view of a conventional heat radiating fin.
Figure 2:
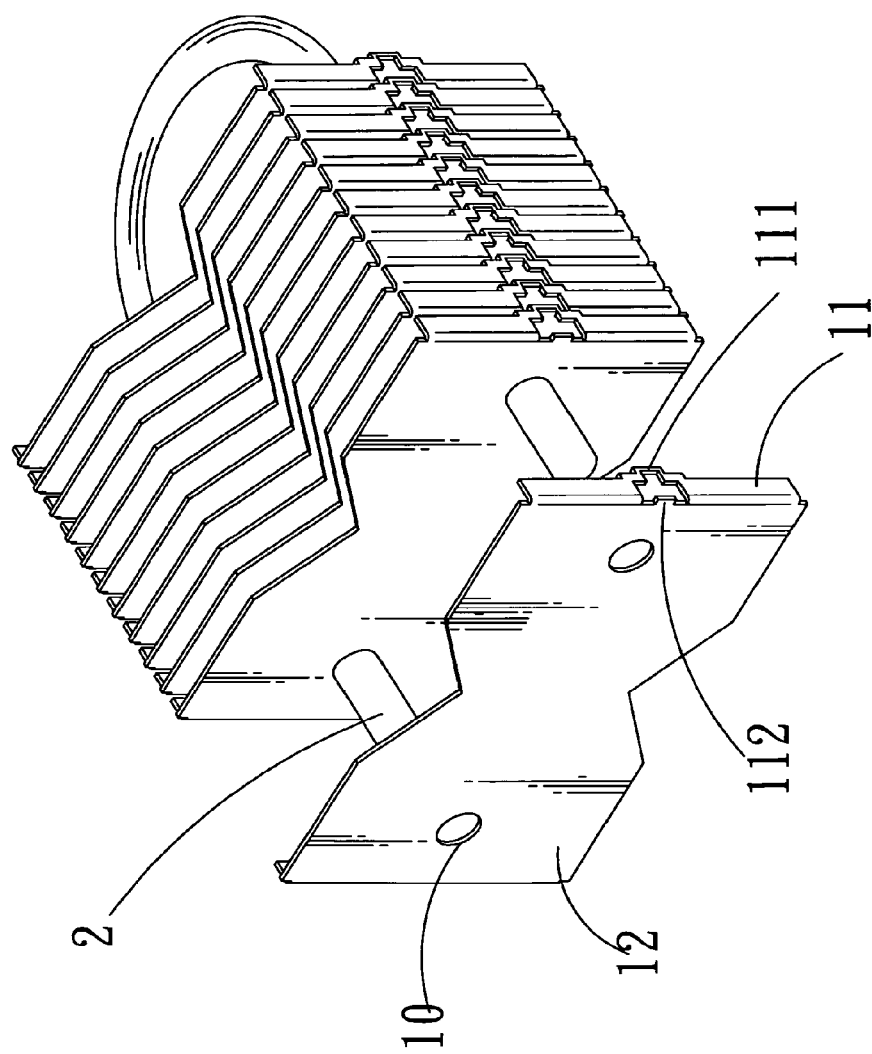
FIG. 2 shows the assembling of a plurality of the conventional heat radiating fins of FIG. 1 into a heat sink.
Figure 3:
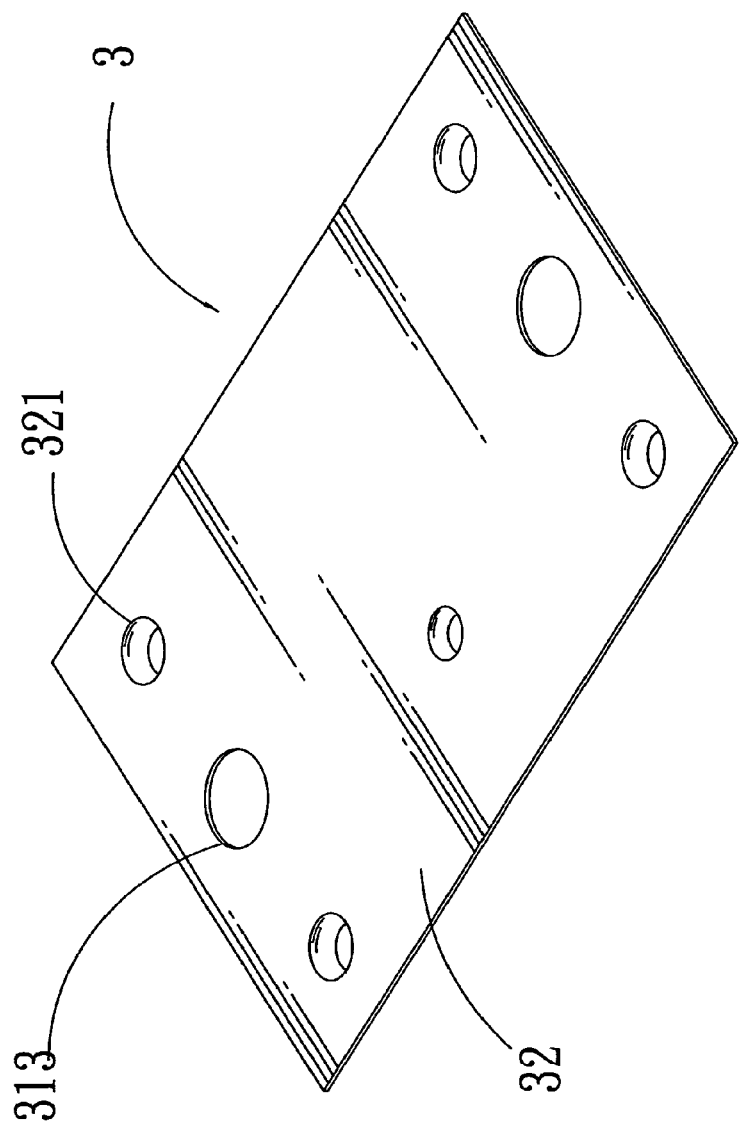
FIG. 3 is a rear perspective view of a heat radiating fin according to a first embodiment of the present invention.
Figure 4:
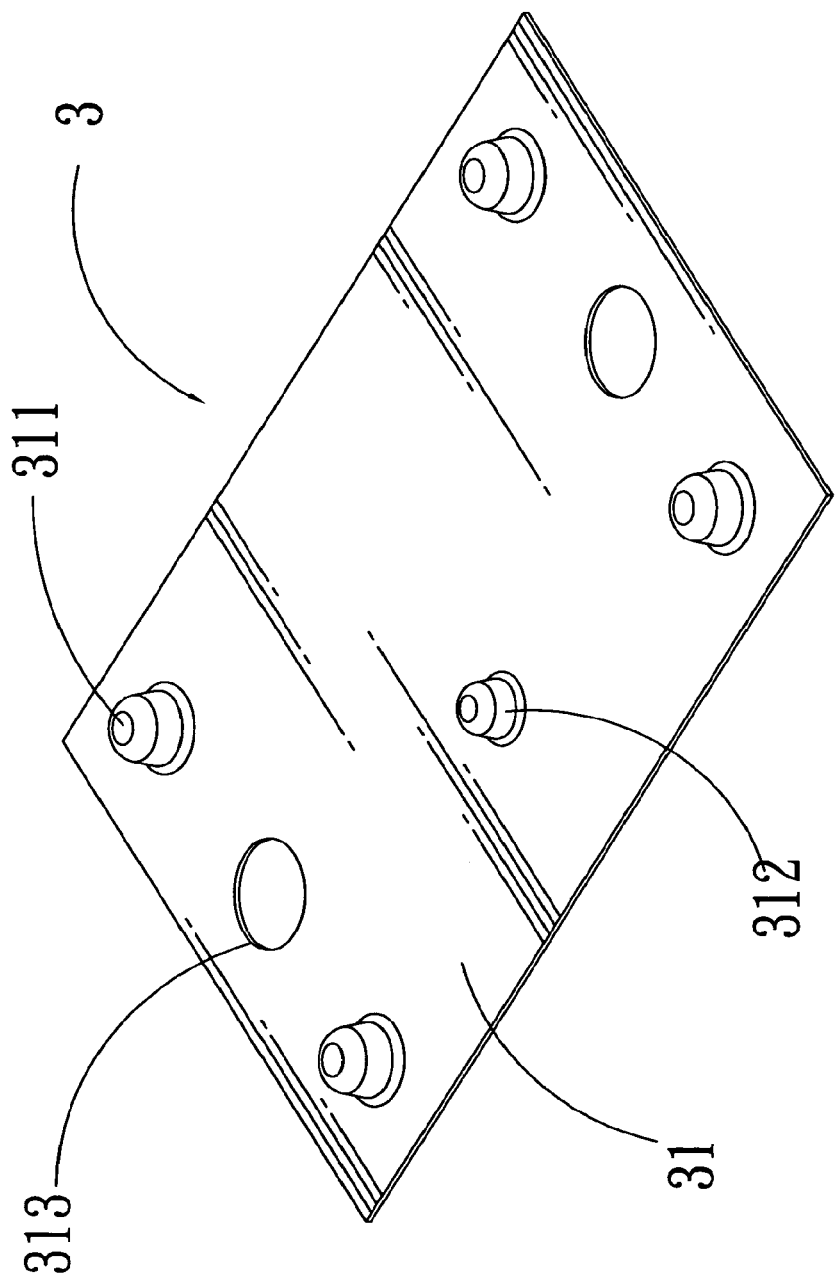
FIG. 4 is a front perspective view of the heat radiating fin of FIG. 3.
Figure 5:
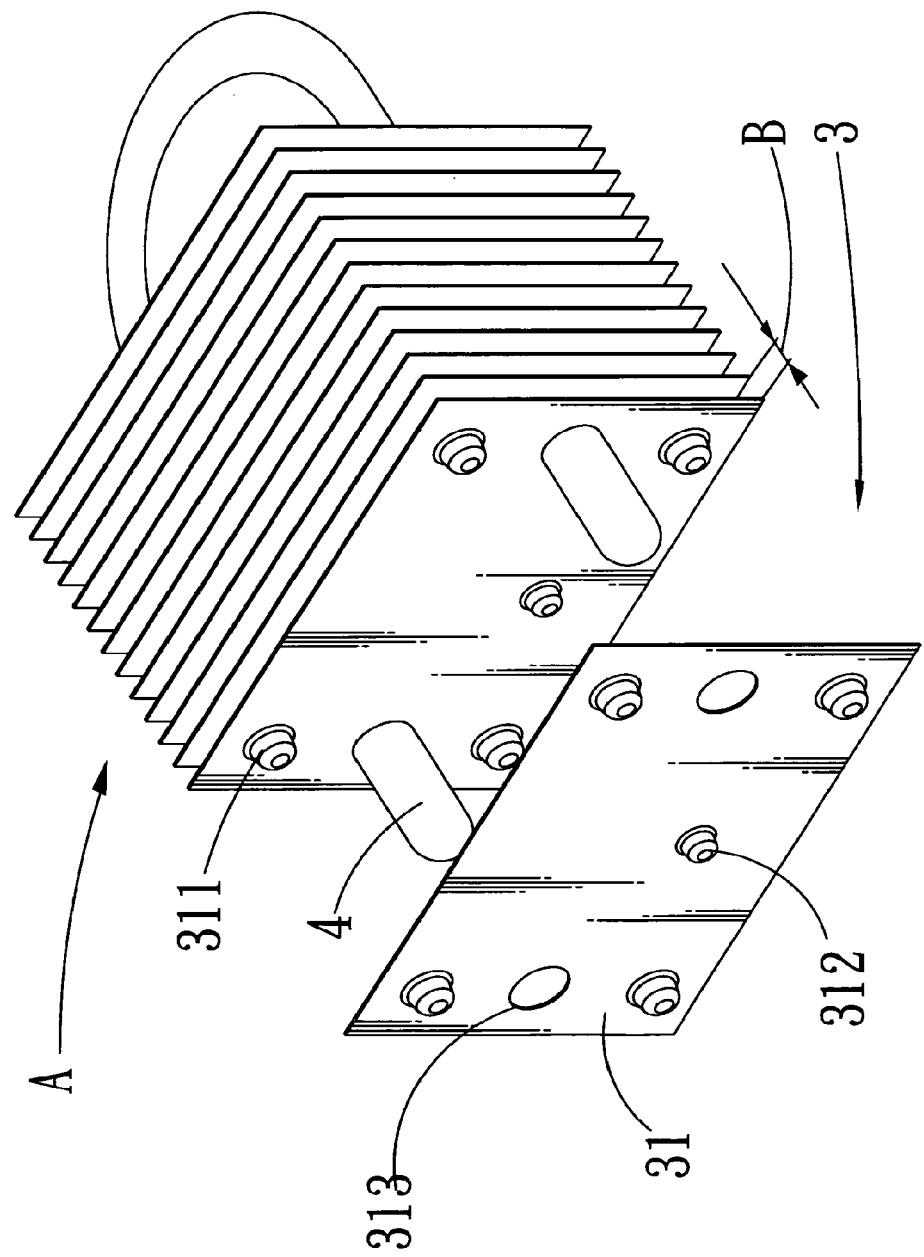
FIG. 5 is a perspective view showing the assembling of a plurality of the heat radiating fins of the present invention into a heat sink.
Figure 6:
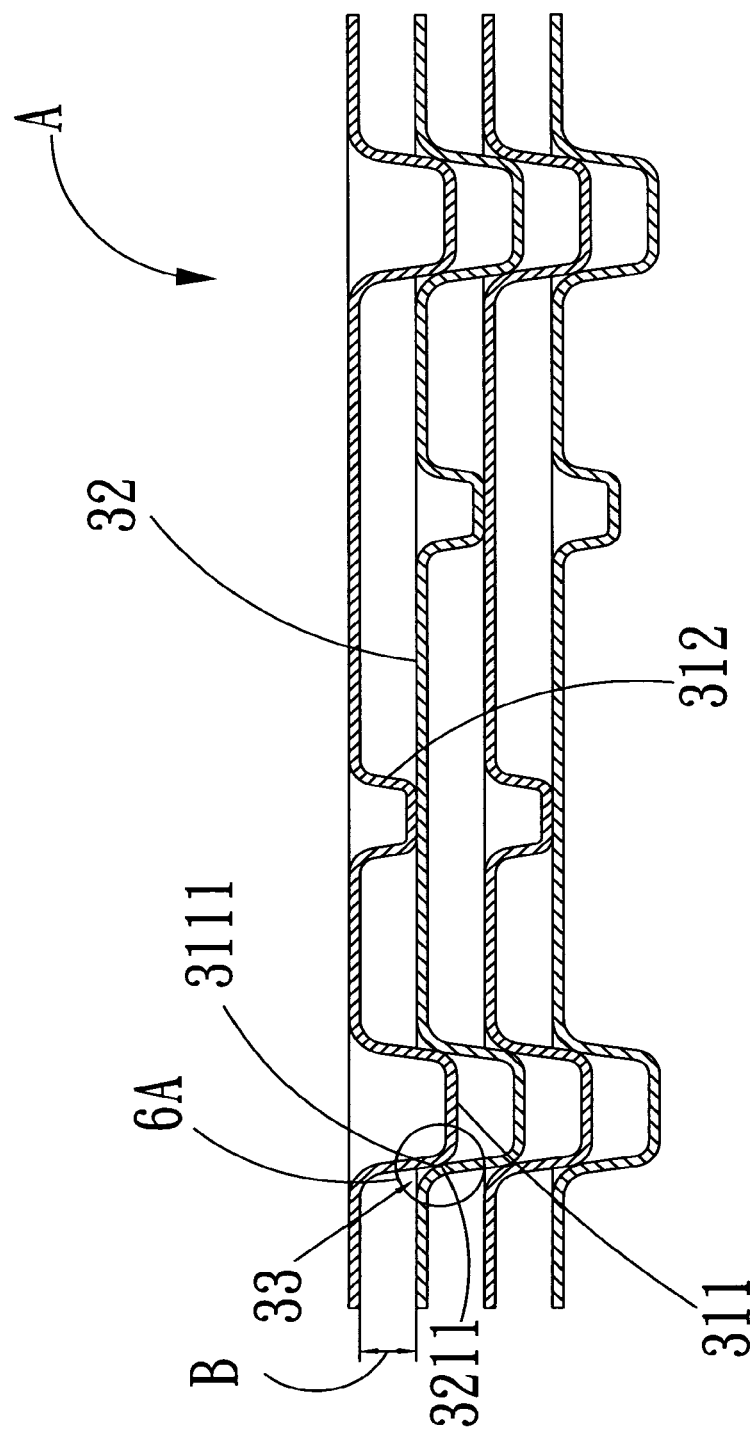
FIG. 6 is an enlarged fragmentary cross sectional view showing the assembled heat radiating fins of the present invention.

Please refer to FIGS. 3 and 4 that are rear and front perspective views, respectively, of a heat radiating fin according to a first embodiment of the present invention; and to FIGS. 5 and 6 that are perspective and sectional views, respectively, showing the assembling of a plurality of the heat radiating fins into a heat sink. As shown, the heat radiating fin of the present invention, which is generally denoted a reference letter "A", includes a flat body 3 having a front side 31 and a rear side 32, and is provided on the front side 31 at predetermined positions with a plurality of protruded portions 311 by way of stretching or drawing. The protruded portions 311 may have a suitable geometrical cross section, such as round, square, polygonal, or other shapes. Since the protruded portions 311 is formed by stretching to raise from the front side 31 of the flat body 3 of the heat radiating fin A by a predetermined distance, recessed portions 321 are formed on the rear side 32 of the flat body 3 corresponding to the protruded portions 311. And, due to being integrally and seamlessly formed on the front side 31 of the flat body by stretching, the protruded portions 311 have relatively high structural strength to resist any deformation when the flat body 3 is subject to external pressure during stacking or is repeatedly dismounted from and remounted to a heat sink. Therefore, the heat radiating fin A may be reused without deformation or adversely affecting the strength and the assembling thereof.

Figure 6A:
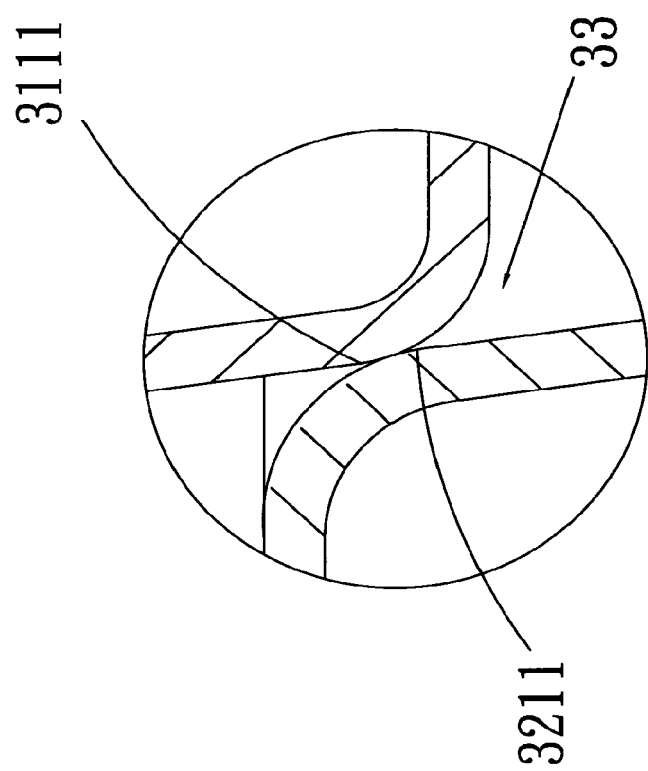
FIG. 6A is an enlarged view of the circled area in FIG. 6.

When a plurality of the heat radiating fins A are stacked and assembled for forming a heat sink, the protruded portions 311 on the flat body 3 of a first heat radiating fin A are partially extended into corresponding recessed portions 321 on the flat body 3 of a second heat radiating fin A located before the first heat radiating fin A, with upper peripheral walls 3111 of the protruded portions 311 bearing against inner rims 3211 of the recessed portions 321 as can be more clearly seen in FIG. 6A, so that the first and the second heat radiating fins A are connected to each other. With the protruded portions 311 and the corresponding recessed portions 321, any two heat radiating fins A may be easily and stably stacked and connected together without causing any deformation of the protruded portions 311 and the recessed portions 321.

The flat body 3 of the heat radiating fin A may be further provided on the front side 31 at predetermined positions with one or more spacer protrusions 312 formed by stretching or drawing to have a predetermined height, such that when any two flat bodies 3 are stacked, the spacer protrusions 312 on the first flat body 3 are in contact with the rear side 32 of the second flat body 3 located before the first flat body 3, allowing the two flat bodies 3 to always maintain a fixed spacing B between them and preventing the protruded portions 311 on the first flat body 3 from excessively extending into the recessed portions 321 on the second flat body 3.

The flat body 3 of the heat radiating fin A is also provided at predetermined positions with at least one assembling through hole 313, via which a heat pipe 4 is extended to associate with the flat body 3.

Figure 7:
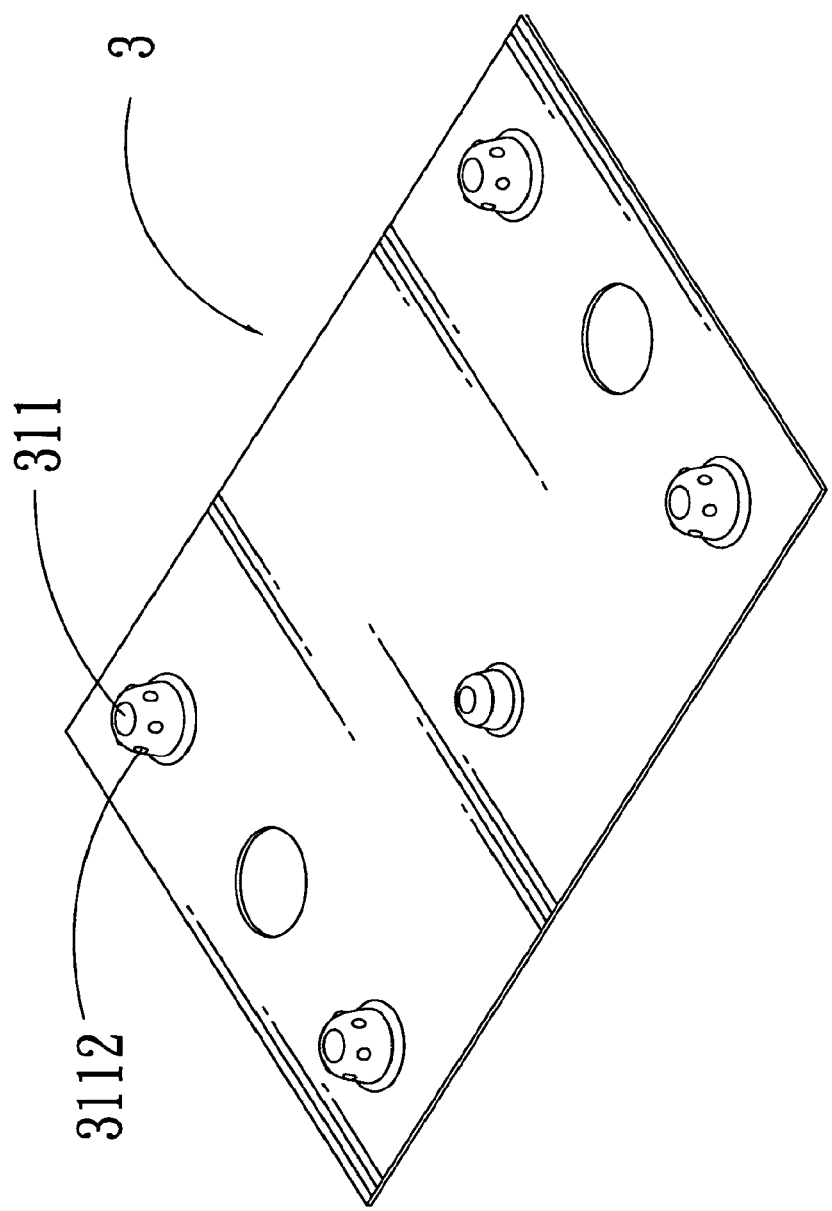
FIG. 7 is a front perspective view showing a heat radiating fin according to a second embodiment of the present invention.
Figure 9:
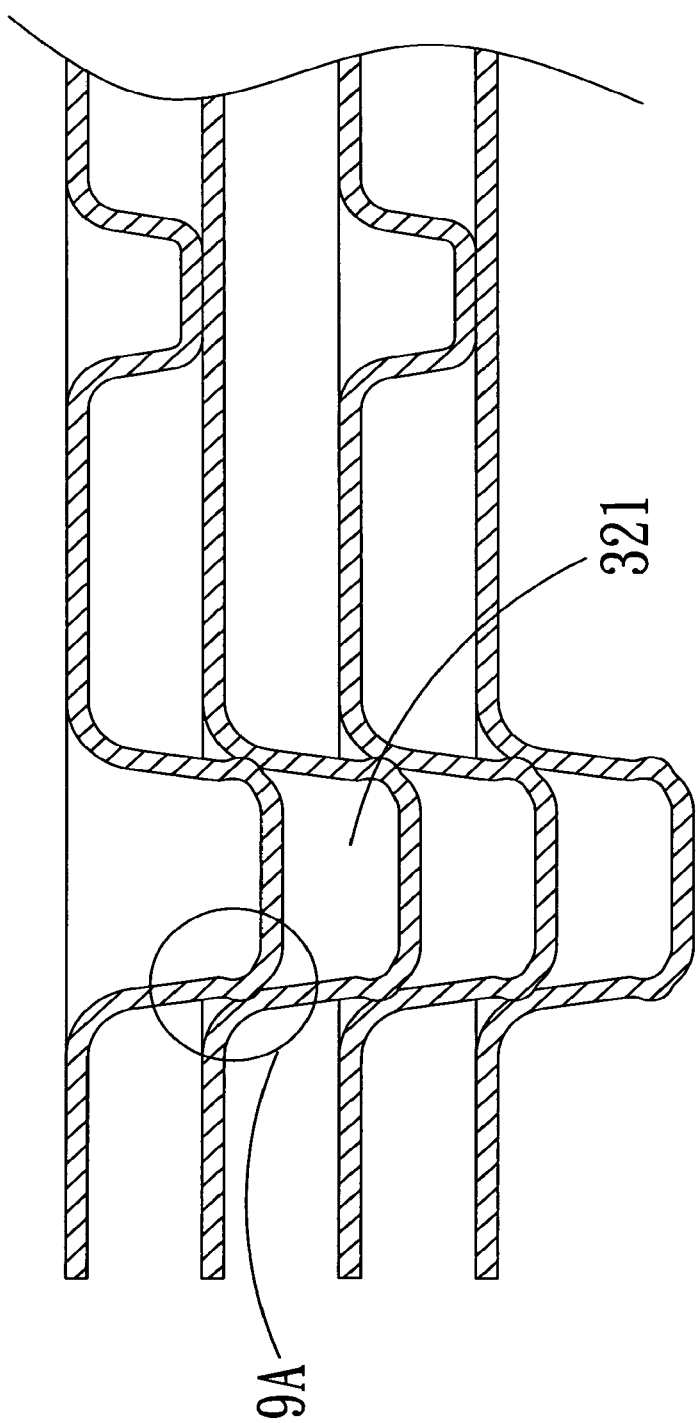
FIG. 9 is a fragmentary cross sectional view showing the assembled heat radiating fins according to the second embodiment of the present invention.
Figure 9A:
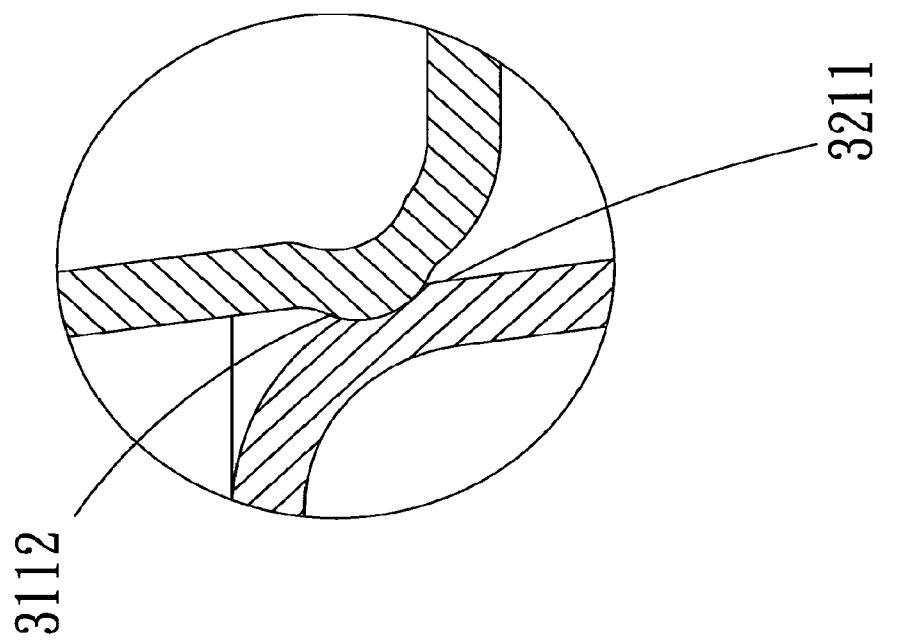
FIG. 9A is an enlarged view of the circled area in FIG. 9.

Please refer to FIGS. 7 and 9, in which a second embodiment of the present invention is shown. In the second embodiment, the protruded portions 311 on the flat body 3 are provided around an outer surface at a predetermined position with a plurality of dots 3112. When two flat bodies 3 are stacked with the protruded portions 311 on the first flat body 3 partially extended into the recessed portions 321 on the second flat body 3 located before the first flat body 3, the dots 3112 on the protruded portions 311 are in contact with the inner rims 3211 of the recessed portions 321 as can be more clearly seen in FIG. 9A, enabling the two flat bodies 3 to be more tightly connected to each other while preventing the protruded portions 311 from excessively extending into the recessed portions 321 to assist the spacer protrusions 312 in maintaining the fixed spacing B.

Figure 8:
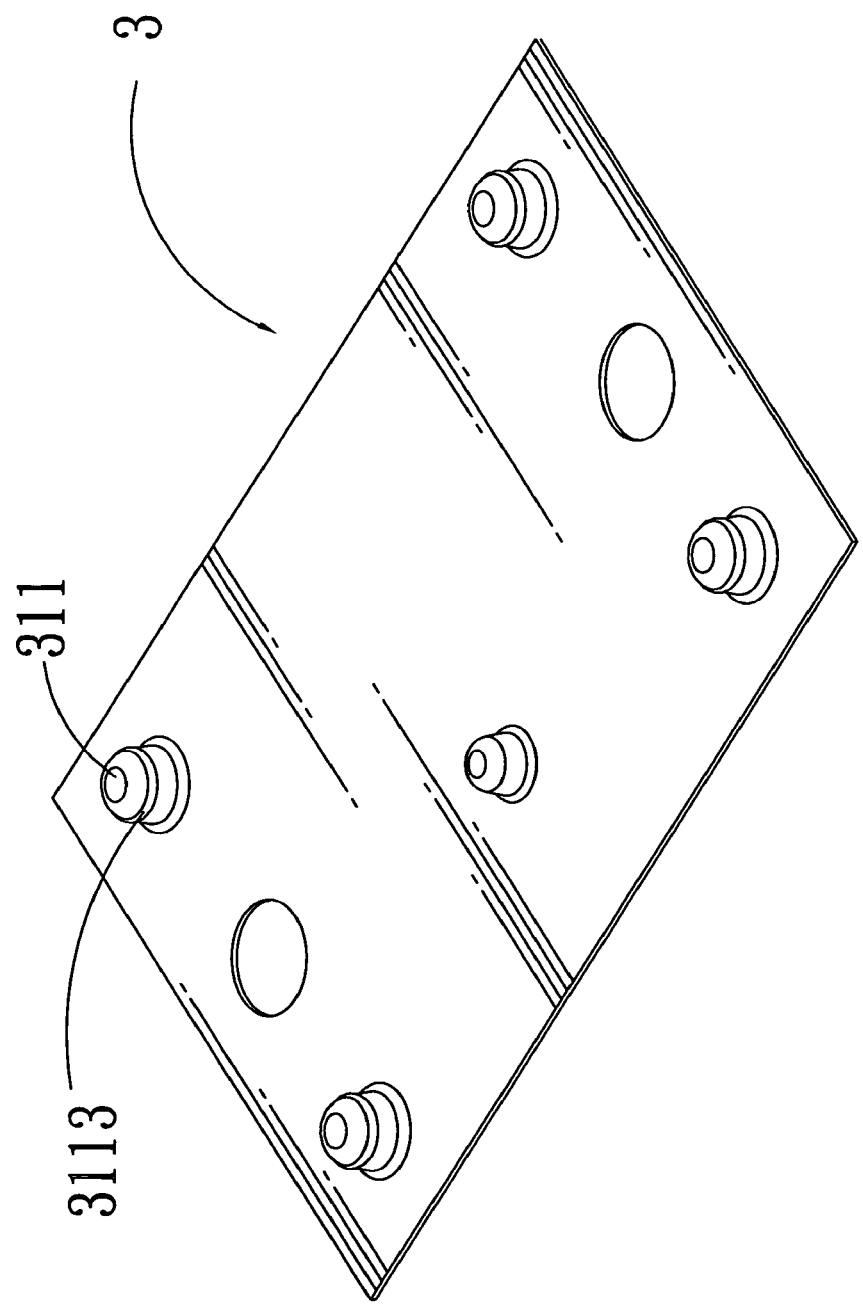
FIG. 8 is a front perspective view showing a heat radiating fin according to a third embodiment of the present invention.

FIG. 8 shows a third embodiment of the present invention. In the third embodiment, the protruded portions 311 are provided around the outer surface at a predetermined position with an annular rib 3113. When two flat bodies 3 are stacked with the protruded portions 311 on the first flat body 3 partially extended into the recessed portions 321 on the second flat body 3 located before the first flat body 3, the annular ribs 3113 on the protruded portions 311 are in contact with the inner rims 3211 of the recessed portions 321, enabling the two flat bodies 3 to be more tightly connected to each other while preventing the protruded portions 311 from excessively extending into the recessed portions 321 to assist the spacer protrusions 312 in maintaining the fixed spacing B.

Figure 10:
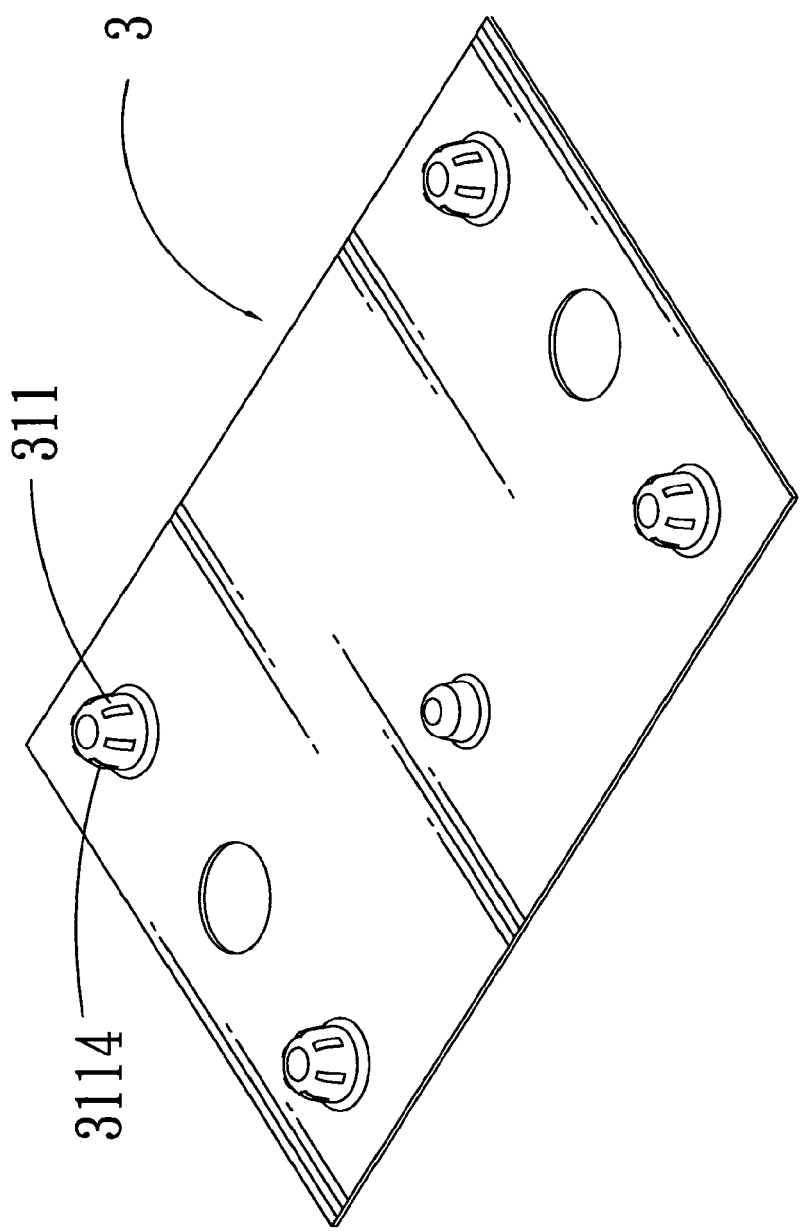
FIG. 10 is a front perspective view showing a heat radiating fin according to a fourth embodiment of the present invention.

FIG. 10 shows a fourth embodiment of the present invention. In the fourth embodiment, the protruded portions 311 are provided around the outer surface at a predetermined position with a plurality of spaced ribs 3114. When two flat bodies 3 are stacked with the protruded portions 311 on the first flat body 3 partially extended into the recessed portions 321 on the second flat body 3 located before the first flat body 3, the spaced ribs 3114 on the protruded portions 311 are in contact with the inner rims 3211 of the recessed portions 321, enabling the two flat bodies 3 to be more tightly connected to each other while preventing the protruded portions 311 from excessively extending into the recessed portions 321 to assist the spacer protrusions 312 in maintaining the fixed spacing B.

Figure 11:
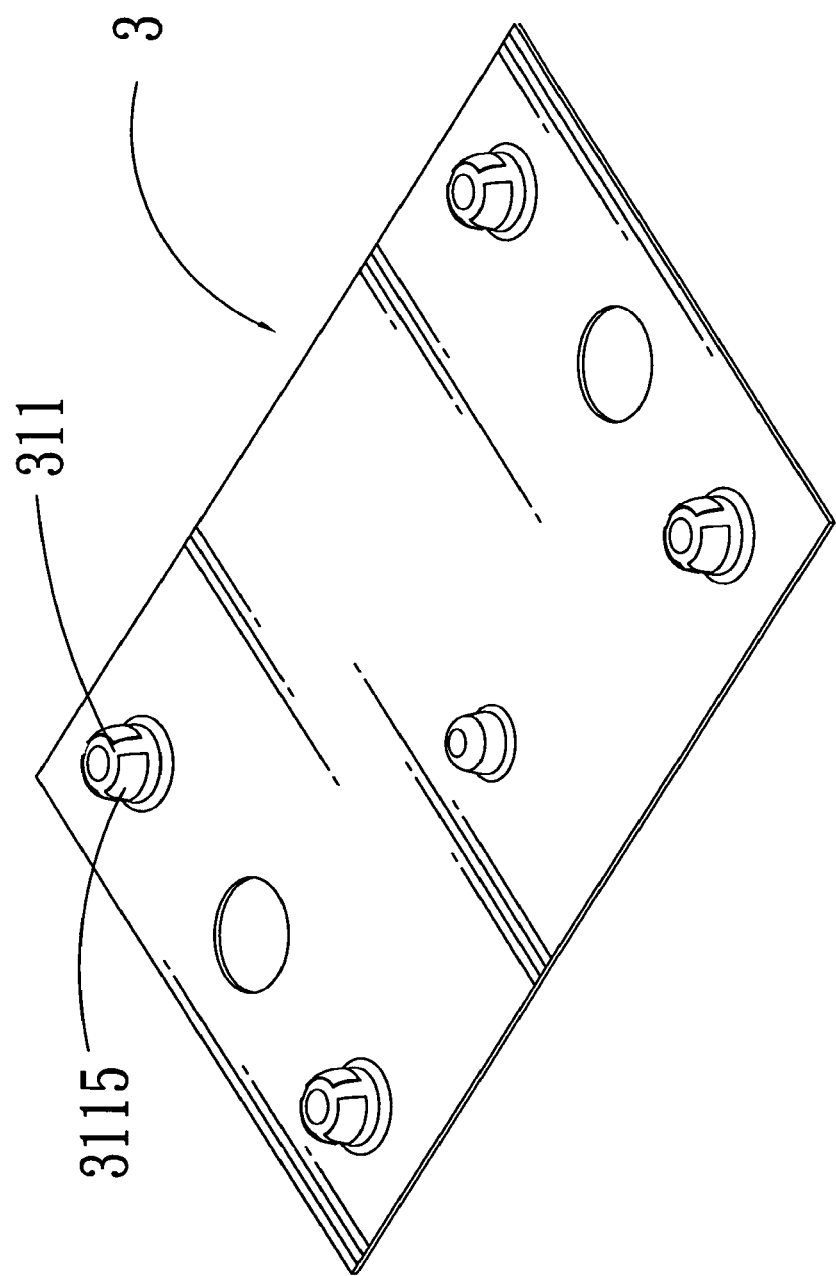
FIG. 11 is a front perspective view showing a heat radiating fin according to a fifth embodiment of the present invention.

FIG. 11 shows a fifth embodiment of the present invention. In the fifth embodiment, the protruded portions 311 are provided around the outer surface at a predetermined position with a plurality of spaced raised areas 3115. When two flat bodies 3 are stacked with the protruded portions 311 on the first flat body 3 partially extended into the recessed portions 321 on the second flat body 3 located before the first flat body 3, the spaced raised areas 3115 on the protruded portions 311 are in contact with the inner rims 3211 of the recessed portions 321, enabling the two flat bodies 3 to be more tightly connected to each other while preventing the protruded portions 311 from excessively extending into the recessed portions 321 to assist the spacer protrusions 312 in maintaining the fixed spacing B.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat radiating fin, comprising:
   a flat body having a front side and a rear side;
   a plurality of dome-shaped protruded portions formed on the front side of the flat body;
   a plurality of recessed portions correspondingly formed on the rear side of the flat body behind the protruded portions;
   wherein the protruded portions on the flat body of a first heat radiating fin are only partially extendable into corresponding recessed portions on the flat body of a second heat radiating fin located before the first heat radiating fin, allowing the first and second heat radiating fins to be stably stacked; and wherein the protruded portions on the flat body of said first heat radiating fin are provided around an outer surface at a predetermined position with an arcuate annular rib extending outward from said protruded portions to contact the corresponding recessed portion of said second heat radiating fin and prevent the protruded portions from excessively extending into the corresponding recessed portions, wherein the arcuate annular rib is located between a top most part and a bottom most part of the protrusion, the arcuate annular rib directly contacts an inside portion of the plurality of recessed portions.

* * * * *